United States Patent
Kobayashi et al.

(10) Patent No.: US 9,602,752 B2
(45) Date of Patent: Mar. 21, 2017

(54) SOLID-STATE IMAGING APPARATUS AND IMAGING SYSTEM

(71) Applicant: CANON KABUSHIKI KAISHA, Tokyo (JP)

(72) Inventors: Hideo Kobayashi, Tokyo (JP); Kohichi Nakamura, Kawasaki (JP); Tetsuya Itano, Sagamihara (JP); Yasushi Matsuno, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/591,180

(22) Filed: Jan. 7, 2015

(65) Prior Publication Data
US 2015/0201144 A1    Jul. 16, 2015

(30) Foreign Application Priority Data
Jan. 16, 2014   (JP) .................. 2014-006145

(51) Int. Cl.
| | | |
|---|---|---|
| *H04N 5/3745* | (2011.01) | |
| *H04N 5/378* | (2011.01) | |
| *H01L 27/146* | (2006.01) | |
| *H03M 1/12* | (2006.01) | |

(52) U.S. Cl.
CPC ....... *H04N 5/378* (2013.01); *H01L 27/14603* (2013.01); *H04N 5/3745* (2013.01); *H04N 5/37452* (2013.01); *H04N 5/37455* (2013.01); *H03M 1/12* (2013.01)

(58) Field of Classification Search
CPC . H04N 5/378; H04N 5/37455; H04N 5/37452
See application file for complete search history.

(56) References Cited

U.S. PATENT DOCUMENTS

| | | |
|---|---|---|
| 7,126,102 B2 | 10/2006 | Inoue et al. |
| 7,321,110 B2 | 1/2008 | Okita et al. |
| 7,408,210 B2 | 8/2008 | Ogura et al. |
| 7,460,162 B2 | 12/2008 | Koizumi et al. |
| 7,462,810 B2 | 12/2008 | Kobayashi et al. |

(Continued)

FOREIGN PATENT DOCUMENTS

JP    2009/9296466 A    12/2009

OTHER PUBLICATIONS

U.S. Appl. No. 14/469,715, filed Aug. 27, 2014.
(Continued)

*Primary Examiner* — Abdelaaziz Tissire
(74) *Attorney, Agent, or Firm* — Fitzpatrick, Cella, Harper & Scinto

(57) ABSTRACT

A solid-state imaging apparatus includes: a pixels in a matrix for generating a pixel signal; and A/D converting units, corresponding to columns of the matrix, to convert the pixel signal into a n-bit digital value. The A/D converting units includes first storage units for storing the n-bit digital value one bit by one bit, and second storage units corresponding to the first storage units, to hold the digital value transferred from the first storage unit. In each of the columns of the plurality of pixels, arranged corresponding thereto are the first storage units and the second storage units form n-pairs. Each pair including the first storage unit and the second storage unit hold the digital value of the same bit. The n-pairs are arrayed in a matrix.

15 Claims, 16 Drawing Sheets

(56) References Cited

U.S. PATENT DOCUMENTS

| | | | |
|---|---|---|---|
| 7,550,793 B2 | 6/2009 | Itano et al. | |
| 7,592,579 B2 | 9/2009 | Tamura et al. | |
| 7,719,587 B2 | 5/2010 | Ogura et al. | |
| 7,741,593 B2 | 6/2010 | Iwata et al. | |
| 7,825,974 B2 | 11/2010 | Itano et al. | |
| 7,920,192 B2 | 4/2011 | Watanabe et al. | |
| 7,982,789 B2 | 7/2011 | Watanabe et al. | |
| 7,990,440 B2 | 8/2011 | Kobayashi et al. | |
| 8,023,025 B2 | 9/2011 | Itano et al. | |
| 8,081,245 B2 | 12/2011 | Itano et al. | |
| 8,085,319 B2 | 12/2011 | Ono et al. | |
| 8,159,577 B2 | 4/2012 | Iwata et al. | |
| 8,159,589 B2 * | 4/2012 | Lim | H04N 5/37455 348/294 |
| 8,174,604 B2 | 5/2012 | Shibata | 348/308 |
| 8,289,431 B2 | 10/2012 | Itano | |
| 8,363,137 B2 | 1/2013 | Sonoda et al. | |
| 8,400,546 B2 | 3/2013 | Itano et al. | |
| 8,451,360 B2 | 5/2013 | Nakamura et al. | |
| 8,598,901 B2 | 12/2013 | Hiyama et al. | |
| 8,710,558 B2 | 4/2014 | Inoue et al. | |
| 8,711,259 B2 | 4/2014 | Maehashi et al. | |
| 8,835,828 B2 | 9/2014 | Kobayashi | |
| 8,836,838 B2 | 9/2014 | Nakamura et al. | |
| 8,884,391 B2 | 11/2014 | Fudaba et al. | |
| 8,928,786 B2 | 1/2015 | Iwata et al. | |
| 8,970,757 B2 | 3/2015 | Kobayashi | |
| 9,288,415 B2 | 3/2016 | Yamazaki et al. | |
| 2002/0024368 A1 * | 2/2002 | Kim | H03K 3/037 327/199 |
| 2009/0115876 A1 * | 5/2009 | Totsuka | H04N 5/3692 348/294 |
| 2009/0303364 A1 * | 12/2009 | Shibata | H04N 5/37455 348/302 |
| 2010/0289931 A1 * | 11/2010 | Shibata | H04N 5/378 348/294 |
| 2011/0187907 A1 * | 8/2011 | Takahashi | H01L 27/146 348/302 |
| 2012/0273657 A1 | 11/2012 | Kobayashi | |
| 2012/0327279 A1 | 12/2012 | Hashimoto et al. | |
| 2013/0002914 A1 * | 1/2013 | Koyama | H04N 5/378 348/294 |
| 2013/0015329 A1 * | 1/2013 | Iwaki | H04N 5/3765 250/208.1 |
| 2013/0016260 A1 * | 1/2013 | Maruta | H04N 5/374 348/294 |
| 2013/0026343 A1 | 1/2013 | Saito et al. | |
| 2013/0062503 A1 | 3/2013 | Saito et al. | |
| 2013/0068930 A1 | 3/2013 | Nakamura et al. | |
| 2013/0140440 A1 | 6/2013 | Kobayashi | |
| 2013/0206961 A1 | 8/2013 | Ikeda et al. | |
| 2013/0271633 A1 | 10/2013 | Hashimoto et al. | |
| 2014/0043511 A1 | 2/2014 | Iwata et al. | |
| 2014/0253767 A1 | 9/2014 | Kato et al. | |
| 2014/0312210 A1 | 10/2014 | Kobayashi | |
| 2015/0042857 A1 | 2/2015 | Kususaki et al. | |
| 2015/0215561 A1 | 7/2015 | Maehashi et al. | |
| 2015/0229832 A1 | 8/2015 | Itano et al. | |
| 2015/0237286 A1 | 8/2015 | Saito et al. | |
| 2015/0281614 A1 | 10/2015 | Yoshida et al. | |
| 2015/0281615 A1 | 10/2015 | Kobayashi et al. | |
| 2015/0281616 A1 | 10/2015 | Muto et al. | |

OTHER PUBLICATIONS

U.S. Appl. No. 14/591,168, filed Jan. 7, 2015.
U.S. Appl. No. 14/614,980, filed Feb. 5, 2015.
U.S. Appl. No. 14/618,143, filed Feb. 10, 2015.
U.S. Appl. No. 14/662,604, filed Mar. 19, 2015.
U.S. Appl. No. 14/663,592, filed Mar. 20, 2015.
U.S. Appl. No. 14/665,137, filed Mar. 23, 2015.

* cited by examiner

SOLID-STATE IMAGING APPARATUS AND IMAGING SYSTEM

BACKGROUND OF THE INVENTION

Field of the Invention

The present invention relates to a solid-state imaging apparatus and an imaging system which are used in a scanner, a video camera, a digital still camera and the like.

Description of the Related Art

In the solid-state image apparatus, a technology is known which has an A/D converter that is arranged in each column of pixels arranged in array, and converts signals sent from each of the pixels into digital data. Japanese Patent Application Laid-Open No. 2009-296466 discloses a technology which holds the digital data in a first storage unit, transfers the held digital data to a second storage unit, and then sequentially outputs the transferred digital data.

It is desired to reduce the area compared to that in the case where a pair of the first storage unit and the second storage unit is arranged in a column direction.

An object of the present invention is to provide a solid-state imaging apparatus and an imaging system which can reduce the area.

SUMMARY OF THE INVENTION

According to an aspect of the present invention, a solid-state imaging apparatus comprises: a plurality of pixels arranged in a matrix, and generating an image signal by photoelectric conversion; and a plurality of A/D converting units, each arranged correspondingly to each of columns of the matrix, to convert the image signal into a n-bit digital value, n being an integer equal to or larger than 1, wherein each of the plurality of A/D converting units comprises a plurality of first storage units configured to store the n-bit digital value one bit by one bit, and a plurality of second storage units each arranged correspondingly to each of the plurality of first storage units, to hold the digital value transferred from the first storage unit, and wherein, in each of the columns of the plurality of pixels, arranged correspondingly thereto are the plurality of first storage units and the plurality of second storage units form n-pairs, each pair including the first storage unit and the second storage unit storing the digital value of the same bit, and the n-pairs are arranged in a matrix.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
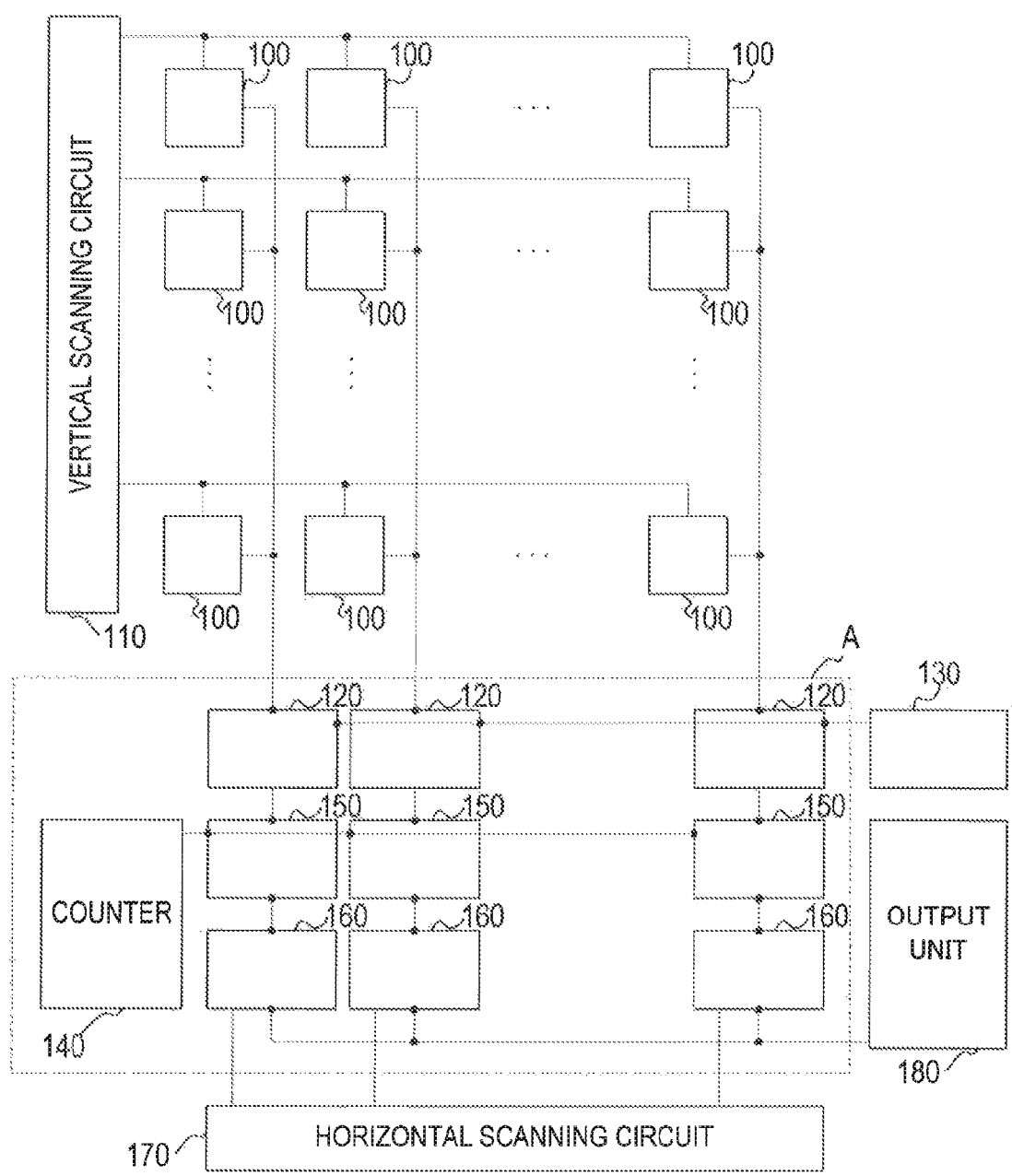
FIG. 1 is a general view illustrating a configuration example of a first embodiment of the present invention.

FIG. 1 is a view illustrating a configuration example of a solid-state imaging apparatus according to a first embodiment of the present invention. A plurality of pixels 100 are arranged in a two-dimensional matrix. Each of the pixels 100 includes, for instance, a photodiode, and generates a pixel signal by photoelectric conversion. Each of the pixels 100 may be provided with an amplifying unit which outputs a voltage signal based on an electric charge generated in the photodiode. A vertical scanning circuit 110 selects the pixels 100 successively row by row, and reads out an analog signal generated in the selected pixel 100 to a comparator 120 in a column direction. A reference voltage generator 130 outputs a reference voltage to the comparator 120 in each of the columns. The plurality of comparators 120 are provided in the respective columns of the pixels 100, and compare the pixel signal of the pixel 100 with the reference voltage. One counter 140 is provided in common with all of the columns of the pixels 100, counts an n-bit digital value, and outputs the counted digital value. It is noted that n is an integer equal to or more than 1. As for a plurality of first storage units 150, n first storage units 150 are provided in each of the columns of the pixels 100, and the first storage units 150 write the n-bit digital value which is output by the counter 140, in each of the columns one bit by one bit, according to a comparison result of the comparator 120 in each of the columns, and hold the written value. A plurality of second storage units 160 are provided so as to correspond to the plurality of first storage units 150, respectively, and hold the digital values transferred from the respective first storage units 150. FIG. 1 schematically illustrates the case in which n is 1. A horizontal scanning circuit 170 sequentially outputs the data stored in the second storage units 160 in each of the columns, to an output unit 180.

More specifically, for instance, the reference voltage generator 130 generates the reference voltage (reference signal) which changes with time. When the reference voltage generator 130 starts the generation of the reference voltage, the counter 140 starts counting. The comparator 120 compares the output signal of the pixel 100 with the reference voltage which is output from the reference voltage generator 130. When the relationship of the magnitude between the output signal of the pixel 100 and the reference voltage is reversed, the output of the comparator 120 is inverted, which becomes a trigger, and the first storage unit 150 stores the output value of the counter 140 therein. As a result, an A/D (analog/digital) converting unit which will be described later converts the pixel signal based on the pixels 100 from the analog signal to the digital signal, and can store the digital signal in the first storage unit 150. After that, a transfer control between the first storage unit 150 and the second storage unit 160 makes the first storage unit 150 transfer the value stored therein to the second storage unit 160, and makes the second storage unit 160 store the transferred value therein. Hereby, while the A/D converting unit converts the output signal of the pixel 100 from the analog signal to the digital signal and stores the converted signal in the first storage unit 150, the horizontal scanning circuit 170 can make the second storage unit 160 output the digital signal corresponding to a previous row to the digital output unit 180. As described above, the A/D (analog/digital) converting unit has the comparator 120, the reference voltage generator 130, the counter 140 and the first storage units 150, is provided in each of the columns of the plurality of pixels 100, and converts the pixel signal which is output by the pixels 100 from the analog signal to the n-bit digital value.

Figure 2:
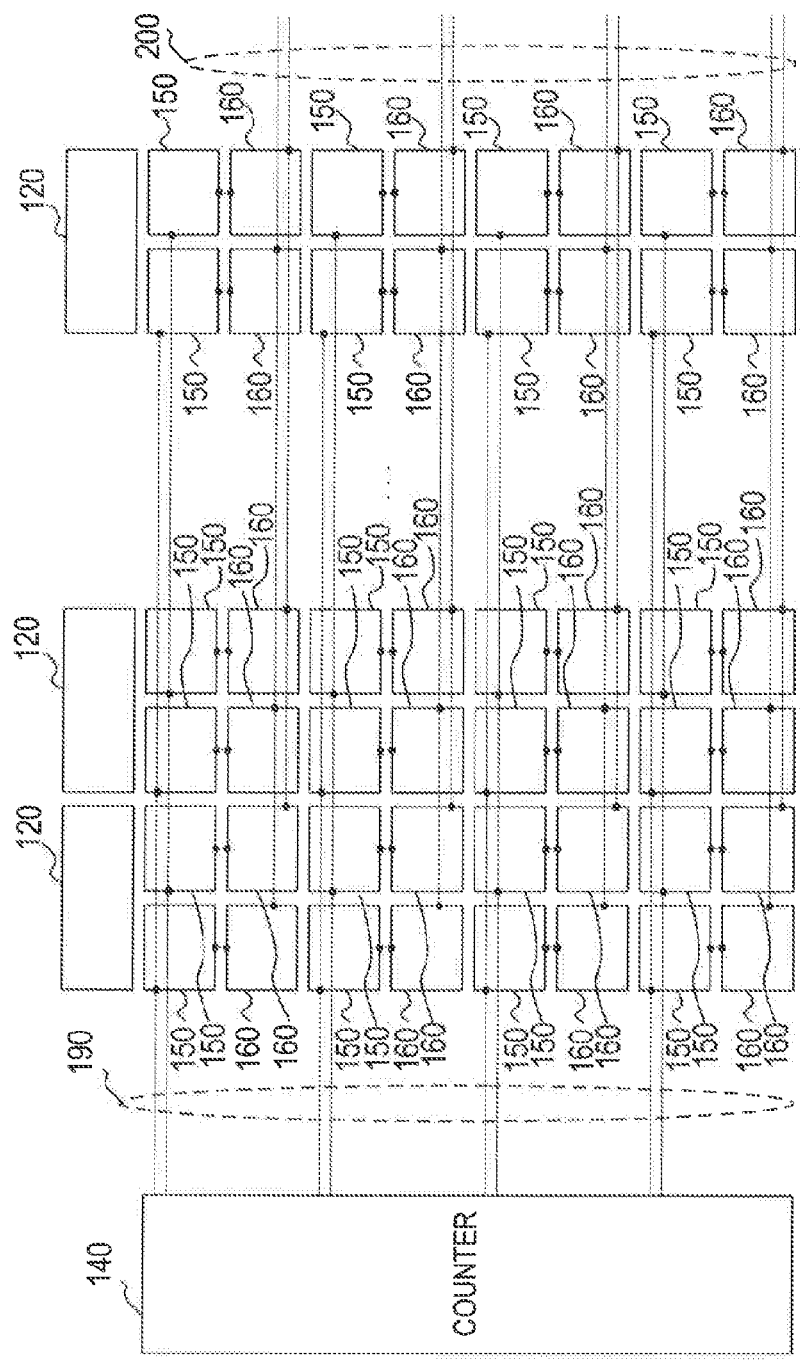
FIG. 2 is a circuit block diagram illustrating the configuration example of the first embodiment of the present invention.

In FIG. 1, an example is illustrated in which the first storage units 150 and the second storage units 160 are simplified, and the first storage unit 150 and the second storage unit 160 each corresponding to one bit are provided in each of the columns. However, actually, as is illustrated in FIG. 2, the solid-state imaging apparatus has the (n) first storage units 150 and the (n) second storage units 160 each corresponding to the number of bits to be subjected to A/D conversion, in each of the columns. FIG. 2 is a view illustrating a more detailed configuration example of a region A in FIG. 1. The counter 140 in common with each of the columns of the pixels 100 is provided. The digital data sent from the counter 140 passes through a data line 190, and is held in the first storage unit 150 corresponding to each of the bits. The data line 190 is connected between the counter 140 and the first storage unit 150. Incidentally, in FIG. 2, the data lines 190 are expressed so as to correspond to 8 bits (n=8) for simplification, but actually any number of bits is acceptable. The digital data held in the second storage unit 160 is output through an output line 200. As for a method of arranging the first storage units 150 and the second storage units 160, when the first storage unit 150 and the second storage unit 160 each corresponding to 1 bit are arranged adjacent to each other in a direction along the column and are regarded as a pair, two pairs of the storage units are arrayed in a direction along the row, and four pairs of the storage units are arrayed in the direction along the column. Specifically, in each of the columns of the plurality of pixels 100, arranged corresponding thereto are the plurality of first storage units 150 and the plurality of second storage units 160 form n-pairs, each pair including the first storage unit and the second storage unit holding the digital value of the same bit, and the n-pairs are arrayed in a two-dimensional matrix. The first storage unit 150 and the second storage unit 160 in the each pair are arrayed adjacent to each other in a direction along the column of the pixels 100. Hereby, the height in the column direction can be reduced, and the area of chips can be reduced. A layout example of the first storage unit 150 and the second storage unit 160 will be described later in detail.

Figure 3:
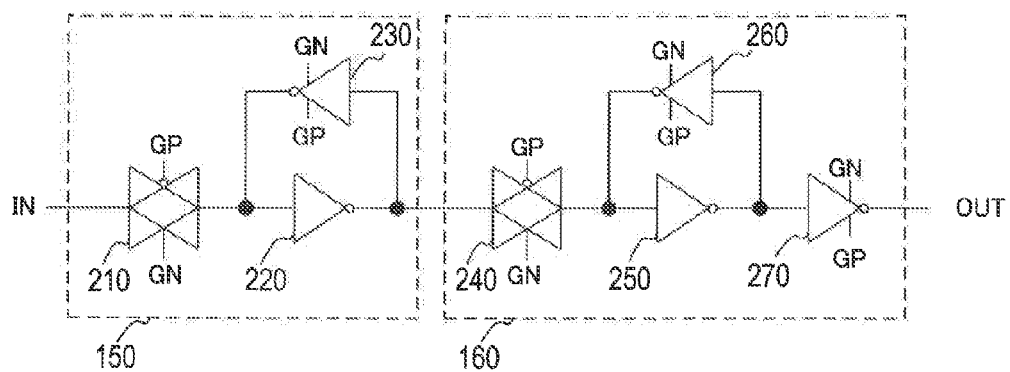
FIG. 3 is a circuit diagram illustrating the configuration example of the first embodiment of the present invention.
Figure 4:
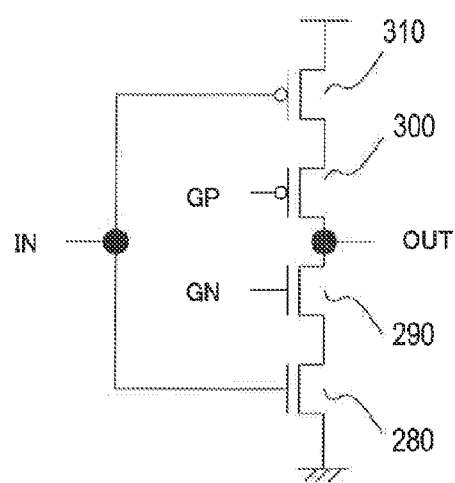
FIG. 4 is a circuit diagram illustrating the configuration example of the first embodiment of the present invention.

FIG. 3 is a circuit diagram illustrating a configuration example of the first storage unit 150 and the second storage unit 160. The first storage unit 150 has a CMOS switch 210, an inverter 220 and a tristate inverter 230. In the inverter 220, an input terminal is connected to an output terminal of the tristate inverter 230, and an output terminal is connected to an input terminal of the tristate inverter 230. A terminal GN of the CMOS switch 210 is a gate terminal of an NMOS switch, and a terminal GP is a gate terminal of a PMOS switch. In addition, the circuit diagram of the tristate inverter 230 is illustrated in FIG. 4. The tristate inverter 230 has NMOS transistors 280 and 290, and PMOS transistors 300 and 310. When the terminal GP is in a high level and the terminal GN is in a low level, the tristate inverter 230 becomes a high-impedance output state. When the terminal GP is in a low level and the terminal GN is in a high level, the tristate inverter 230 performs a similar operation to that of an inverter. When the CMOS switch 210 is in an ON state and the tristate inverter 230 is in a high-impedance output state, the first storage unit 150 becomes a state of writing an input signal thereinto. After the signal is written, the CMOS switch 210 is switched to an OFF state, the tristate inverter 230 is switched to the state of an inverter operation, and thereby the first storage unit 150 holds the signal therein.

In addition, the second storage unit 160 has a CMOS switch 240, an inverter 250, and tristate inverters 260 and 270. The second storage unit 160 is a storage unit which has a tristate inverter 270 in addition to the first storage unit 150. A writing operation and a holding operation of the second storage unit 160 for the signal are similar to those of the first storage unit 150. When outputting the signal, the second storage unit 160 outputs the signal by setting the tristate inverter 270 to the state of the inverter operation. As is illustrated in FIG. 2, the outputs of the second storage units 160 of the same bit in each of the columns are short-circuited to each other on the output wire 200. Therefore, the second storage unit 160 sequentially outputs the signal in each of the columns while using the tristate inverter 270 as an output element, and thereby prevents the generation of a through-current.

Figure 5:
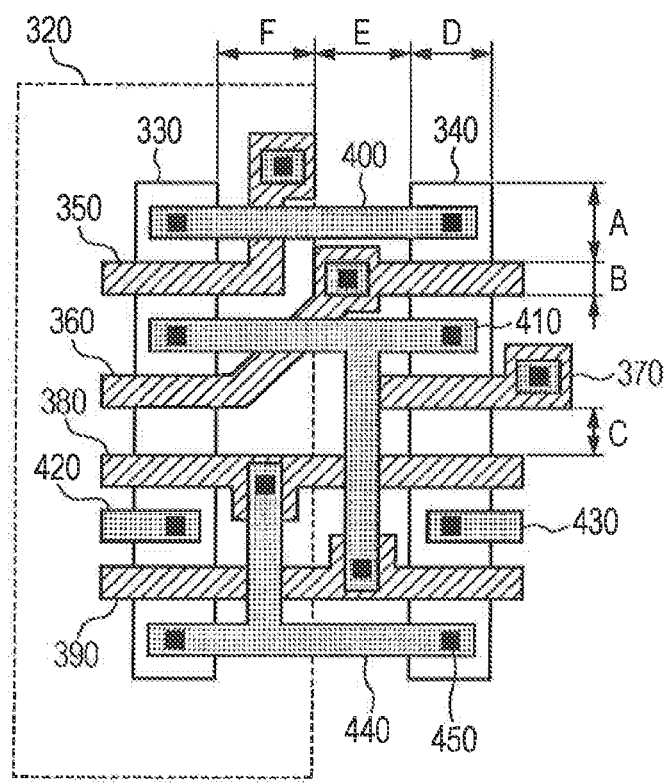
FIG. 5 is a layout chart illustrating a layout example of the first embodiment of the present invention.

FIG. 5 is a view illustrating a layout example of the first storage unit 150. Incidentally, FIG. 5 is also a layout example of a portion from which the tristate inverter 270 is removed from the configuration of the second storage unit 160. A P-well region 320, an N-type active region 330 and a P-type active region 340 are shown. Incidentally, a region outside the range of the P-well region 320 is formed to be an N-well region. Poly-gate electrodes 350, 360, 370, 380 and 390, and metal wires 400, 410, 420, 430 and 440 are shown. In addition, a box-shaped region 450 is a contact region. The contact region 450 connects the metal wires 400 to 440, with the N-type active region 330, the P-type active region 340 or the poly-gate electrodes 350 to 390, all of which exist under the metal wires 400 to 440.

The NMOS transistor which has the N-type active region 330 and the poly-gate electrode 350, and the PMOS transistor which has the P-type active region 340 and the poly-gate electrode 360 constitute the CMOS switch 210 in FIG. 3. The metal wire 400 connects one end of the NMOS transistor and one end of the PMOS transistor to each other, and becomes an input terminal of the CMOS switch 210. The metal wire 410 connects the other end of the NMOS transistor and the other end of the PMOS transistor to each other, and becomes an output terminal of the CMOS switch 210. In addition, the metal wire 410 is connected also to the poly-gate electrode 390, and the poly-gate electrode 390 becomes an input terminal of the inverter 220 in FIG. 3. The metal wire 440 becomes an output terminal of the inverter 220. In addition, the metal wire 420 is connected to a ground potential node, and the metal wire 430 is connected to a power source voltage node, though the nodes are not illustrated. Incidentally, in FIG. 5, only the metal wires for one layer are illustrated for simplification. The metal wire 440 is connected also to the poly-gate electrode 380, and the metal wire 440 becomes an input terminal of the tristate inverter 230 in FIG. 3. The output of the tristate inverter 230 is the metal wire 410, and is connected to the poly-gate electrode 390 which is the input of the inverter 220 and the output terminal of the CMOS switch 210, as described above. Incidentally, the poly-gate electrode 360 becomes the terminal GP of the CMOS switch 210 and the terminal GN of the tristate inverter 230 in FIG. 3. According to the writing operation and the holding operation described above, the poly-gate electrode 360 becomes a low level in the case of the writing operation, and becomes a high level in the case of the holding operation. In the N-type active region 330 of the first storage unit 150 and the second storage unit 160, a plurality of NMOS transistors are provided, which align in a direction along the columns of the pixels 100. In addition, in the P-type active region 340 of the first storage unit 150 and the second storage unit 160, a plurality of PMOS transistors are provided, which align in a direction along the columns of the pixels 100.

In addition, in FIG. 5, a length A of the active region including the contact region 450, a length B of the poly-gate, and a length C of the active region including no contact region 450 are shown. In addition, in FIG. 5, a width D of the active region, a distance E between the P-type active region 340 and the P-well region 320, and a distance F between the N-type active region 330 and the N-well region are shown. FIG. 5 is illustrated by a scale according to a design rule of A=2.5B, C=1.5B, D=2.5B, E=3B and F=3B. The length in a longitudinal direction of the active regions 330 and 340 can be calculated from these numbers, and are each 4A+4B+C=15.5B. In addition, a distance between the left end of the N-type active region 330 and the right end of the P-type active region 340 is 2D+E+F=11B.

Figure 6:
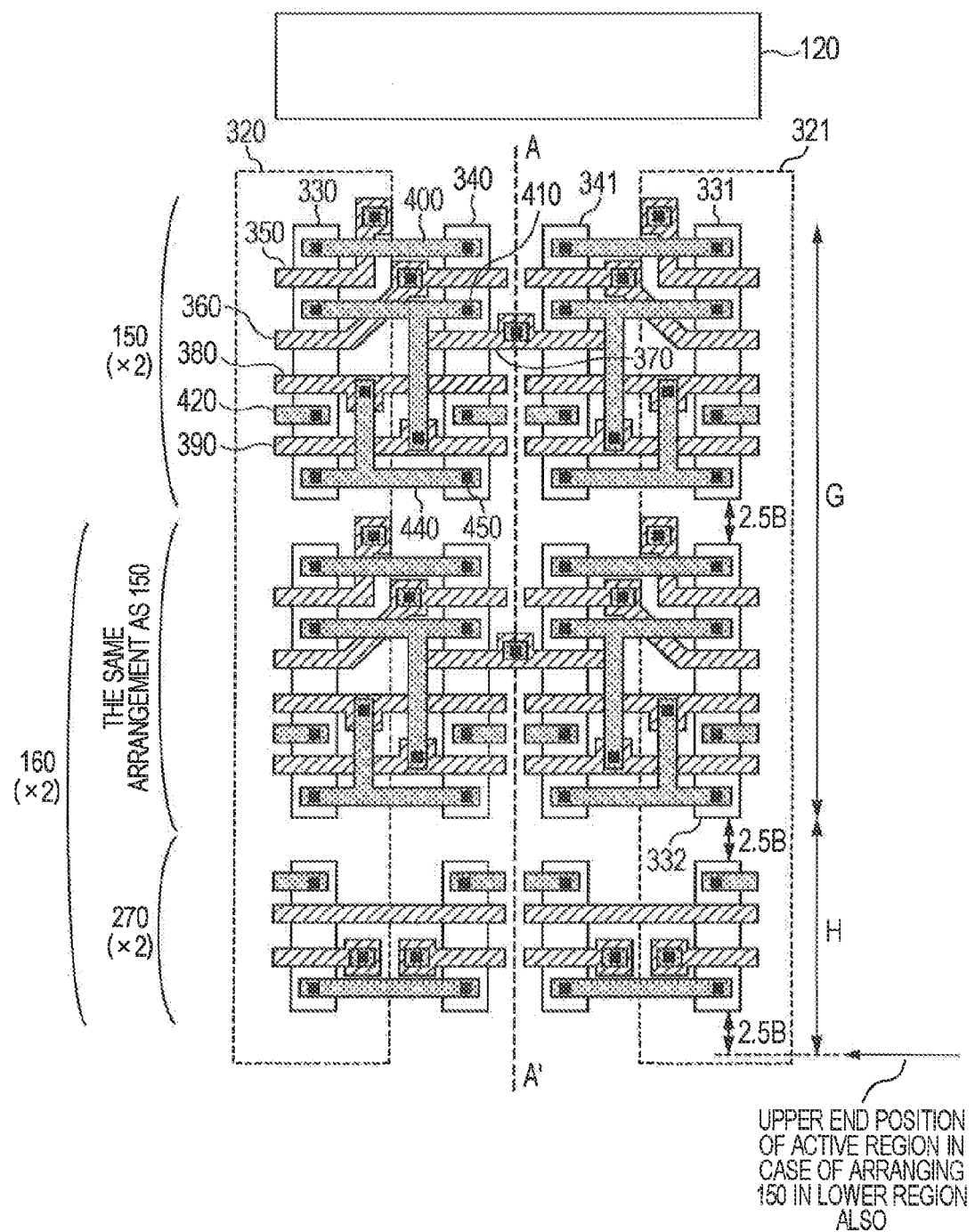
FIG. 6 is a layout chart illustrating the layout example of the first embodiment of the present invention.
Figure 7:
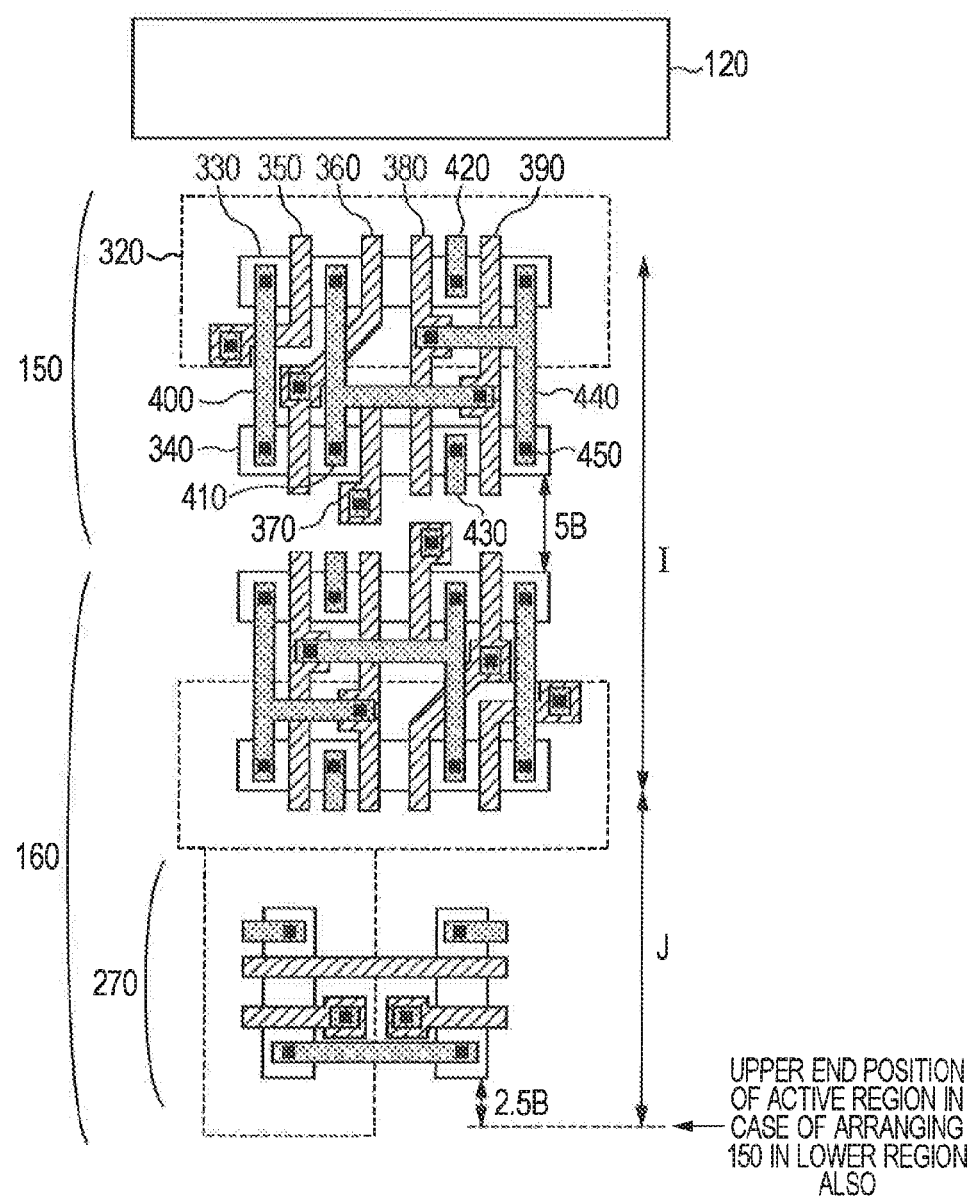
FIG. 7 is a layout chart.

FIG. 6 is a view illustrating a layout example for one comparator 120 illustrated in FIG. 2, and 2 pairs of the first storage units 150 and the second storage units 160 illustrated in FIG. 2. In FIG. 6, 2×2 patterns of the layout illustrated in FIG. 5 are arranged, and the tristate inverters 270 are arranged under the patterns. In other words, two pairs of the storage units are arranged in the row direction, in each of which the first storage units 150 and the second storage units 160 are arranged in the column direction. From the above described calculation, the height of the N-type active region 331 is 15.5B, and accordingly the height of G in the figure is 15.5B×2+2.5B=33.5B. In addition, the height of H is 13.5B, and accordingly the total of G and H is 47B. However, the two pairs are arranged in the row direction, and accordingly the height per one pair becomes 23.5B. Thus, there is a technique of arranging the plurality of pairs of the storage units in the row direction, and thereby reducing the height for one pair of the storage units. In contrast to the technique, another technique is also considered, which forms one pair of the storage units into a horizontally longer shape as is illustrated in FIG. 7, and thereby reduces the height. In this technique, only one pair of the storage units is arranged in the row direction, in which the first storage unit 150 and the second storage unit 160 are arranged. In FIG. 7, the directions of the N-type active region 330 and the P-type active region 340 are changed by 90 degrees, the direction of the alignment of each of the MOS transistors is changed to the row direction from the column direction, and thereby the height for one pair of the storage units is reduced. The height from the upper end of the N-type active region 330 to the lower end of the P-type active region 340 is 11B according to the above described calculation result, and accordingly the height of I in the figure is 11B×2+5B=27B. In addition, the height of J is approximately 17B, and accordingly the total of I and J is 44.5B. Therefore, the layout in FIG. 7 cannot reduce the area compared to that in FIG. 6 in which the height for one pair is 23.5B. Therefore, in the layout in FIG. 6 of the present embodiment, a technique of arranging the pair of the storage units in a two-dimensional form can more reduce the area than the technique of arranging the pair in a one-dimensional form in the column direction.

In FIG. 6, two pairs of the first storage units 150 and the second storage units 160 are adjacent to each other, and become a layout in the line symmetry which regards the line A-A' as a center. Hereby, the P-type active regions 340 and 341 which have the same polarity and are active are arranged adjacent to each other, and thereby the width in the row direction can be reduced. When the N-type active region 331 is arranged adjacent to the P-type active region 340, a space between the P-type active region 340 and the P-well region 321 needs to be prepared, and accordingly a distance between the P-type active region 340 and the N-type active region 331 results in being large.

In FIG. 6, it is understood that the poly-gate electrode 370 overlaps with the two P-type active regions 340 and 341, and becomes a gate electrode of each of the two PMOS transistors. This means that the terminal GP of the tristate inverter 230 in FIG. 3 is short-circuited between the two first storage units 150. However, both of the first storage units 150 of which the writing operation is controlled by the output signal of the same comparator 120 perform the writing operation according to the same control signal, and accordingly there is no such problem that the terminals GP of the tristate inverter 230 are short-circuited to each other. The control signal which is input to the poly-gate electrode 370 is input from a wire which is a metal wire arranged in the upper layer than the metal wires 400 to 440 and passes from the comparator 120 in the column direction (not illustrated). As is illustrated in FIG. 6, the poly-gate electrode 370 is arranged to be common between the two MOS transistors, and thereby the above described wire of the control signal can be reduced to 1 wire, instead of 2 wires. Hereby, the lowering of a yield due to the short circuit between the wires can be prevented. In addition, when there are a large number of control wires in the longitudinal direction, the width of the wires in the row direction results in increasing due to the number of the wires, and accordingly the layout in FIG. 6 contributes also to the reduction of the width in the row direction.

Figure 8:
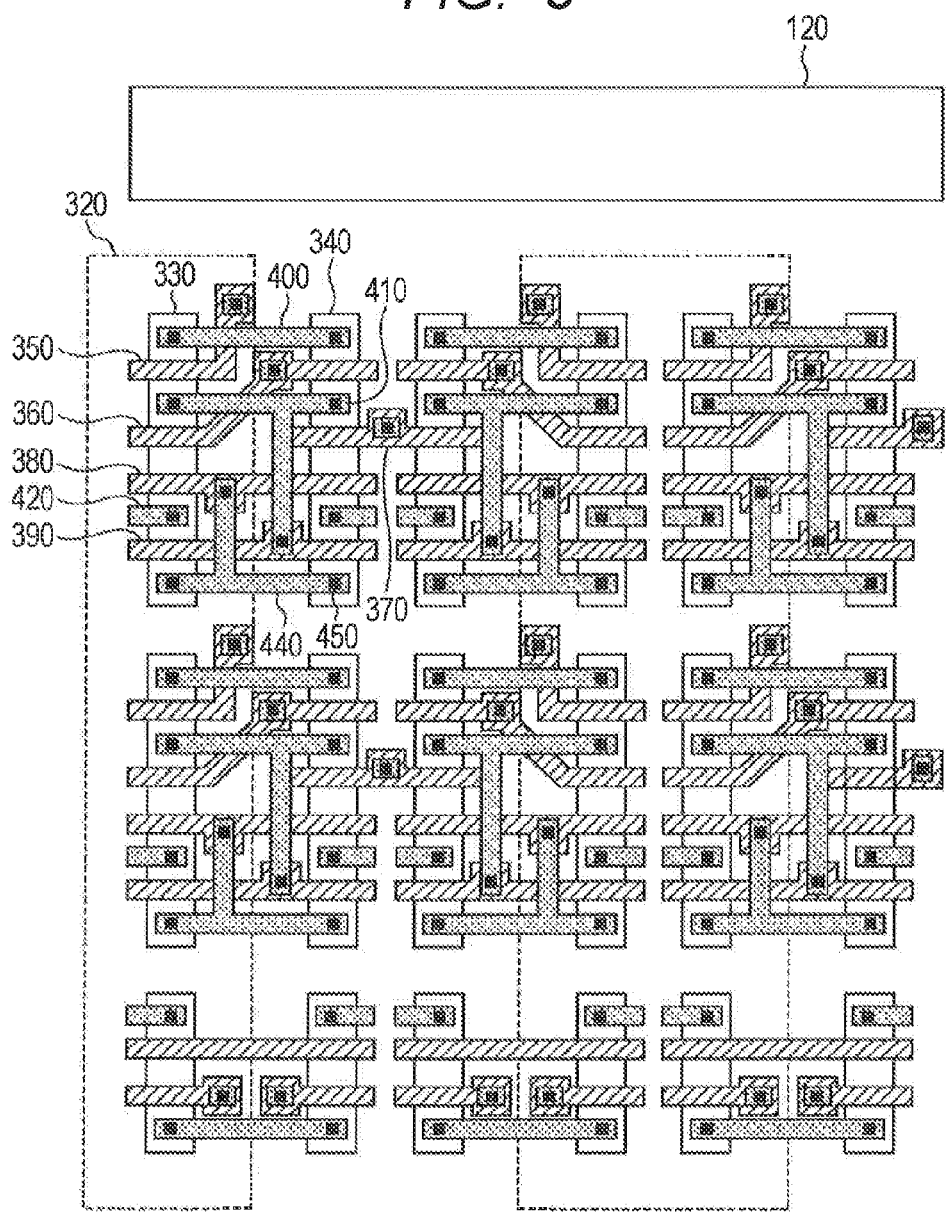
FIG. 8 is a layout chart illustrating the layout example of the first embodiment of the present invention.
Figure 9:
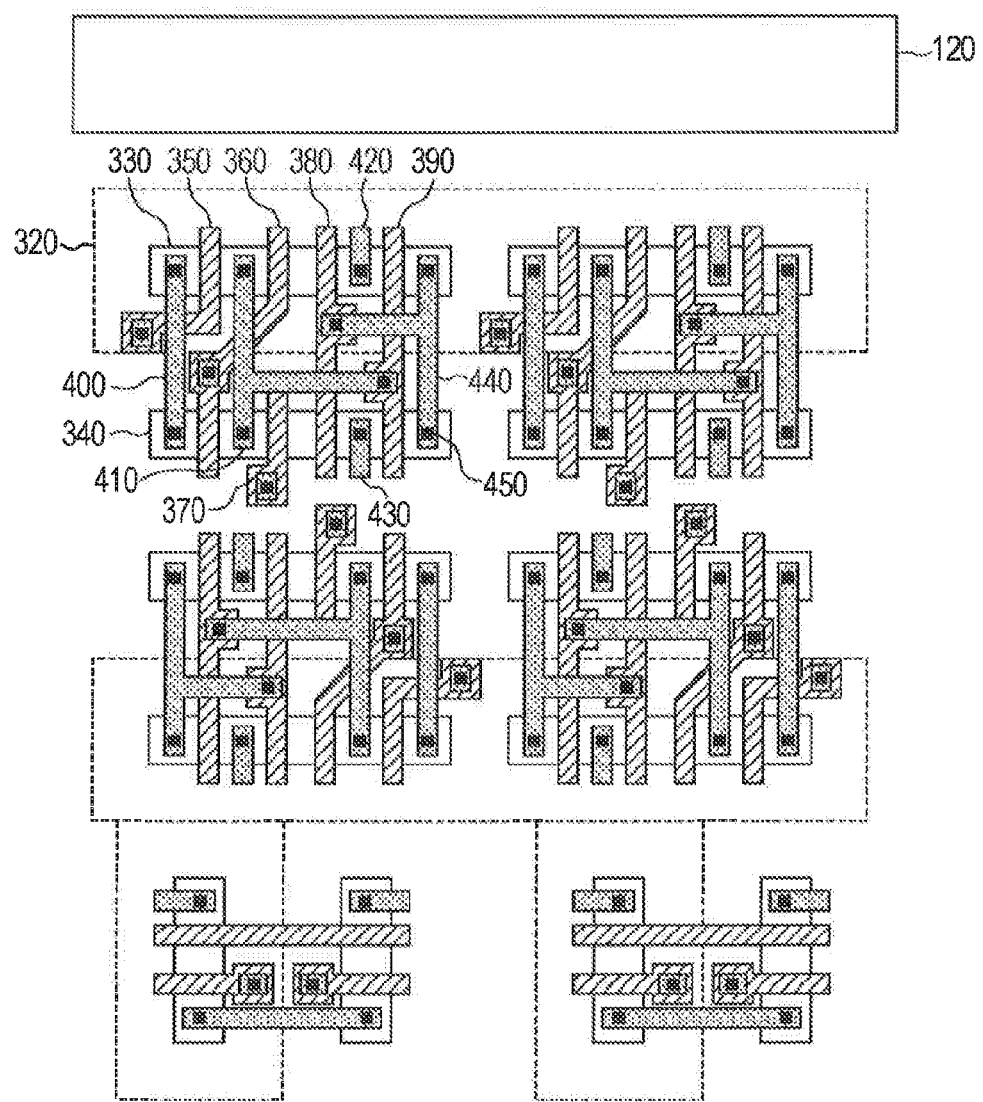
FIG. 9 is a layout chart illustrating the layout example of the first embodiment of the present invention.

When the width of the comparator 120 in the row direction is larger than those in FIG. 6 and FIG. 7, it is considered to adopt a layout in any of FIG. 8 and FIG. 9. In FIG. 6, the two pairs of the storage units are arranged in the row direction, each of which includes the first storage unit 150 and the second storage unit 160, but in FIG. 8, three pairs of the storage units are arranged in the row direction, each of which includes the first storage unit 150 and the second storage unit 160.

In FIG. 9, the two pairs of the storage units are arranged in the row direction, each of which includes the first storage unit 150 and the second storage unit 160 in FIG. 7. In each of the N-type active regions 330 of the first storage unit 150 and the second storage unit 160, a plurality of NMOS transistors are provided which align in a direction along the row of the pixels 100. In addition, in each of the P-type active regions 340 of the first storage unit 150 and the second storage unit 160, a plurality of PMOS transistors are provided which align in a direction along the row of the pixels 100.

Figure 10:
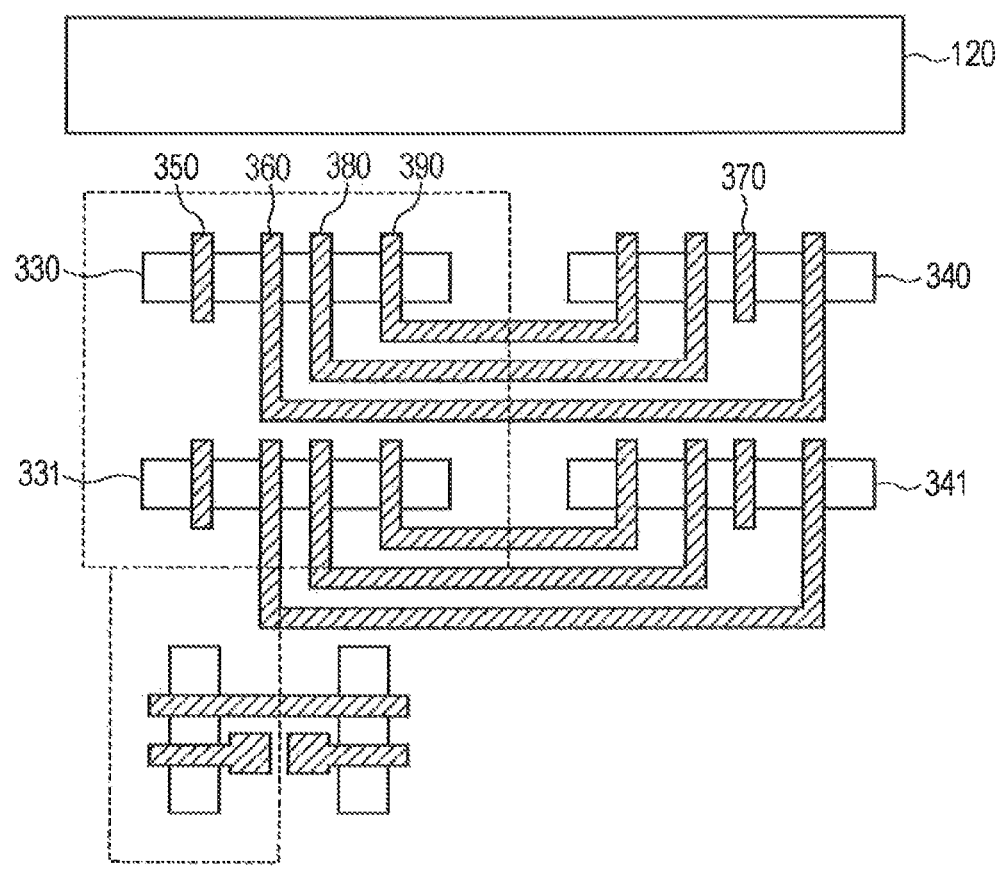
FIG. 10 is a layout chart.

In FIG. 8, the height per one pair of the storage units is 47B/3=15.7B, but in FIG. 9, the height is 44.5B/2=22.25B. Accordingly, the layout in FIG. 8 is more advantageous than the layout in FIG. 9, from the viewpoint of the area. In other words, it is more advantageous to form the active region (for instance, region 330 and the like) into a longitudinally long shape, and align the MOS transistors in the column direction. However, even FIG. 9 is more advantageous than FIG. 10 from the viewpoint of the area. In FIG. 10, the P-type active region 340 is arranged beside the N-type active region 330, and thereby the height is reduced. However, the patterns of the poly-gate electrodes 360, 380 and 390 become complicated, and accordingly the height of the pair of the storage units cannot be reduced to a half or less of that in FIG. 9. Therefore, as has been assumed, it is understood that the area can be more reduced at the time when the pair of the storage units are arranged in a two-dimensional form than the time when only one pair of the storage units are arranged in the row direction as in FIG. 10 (arranged in one-dimensional form in column direction).

Second Embodiment

Figure 11:
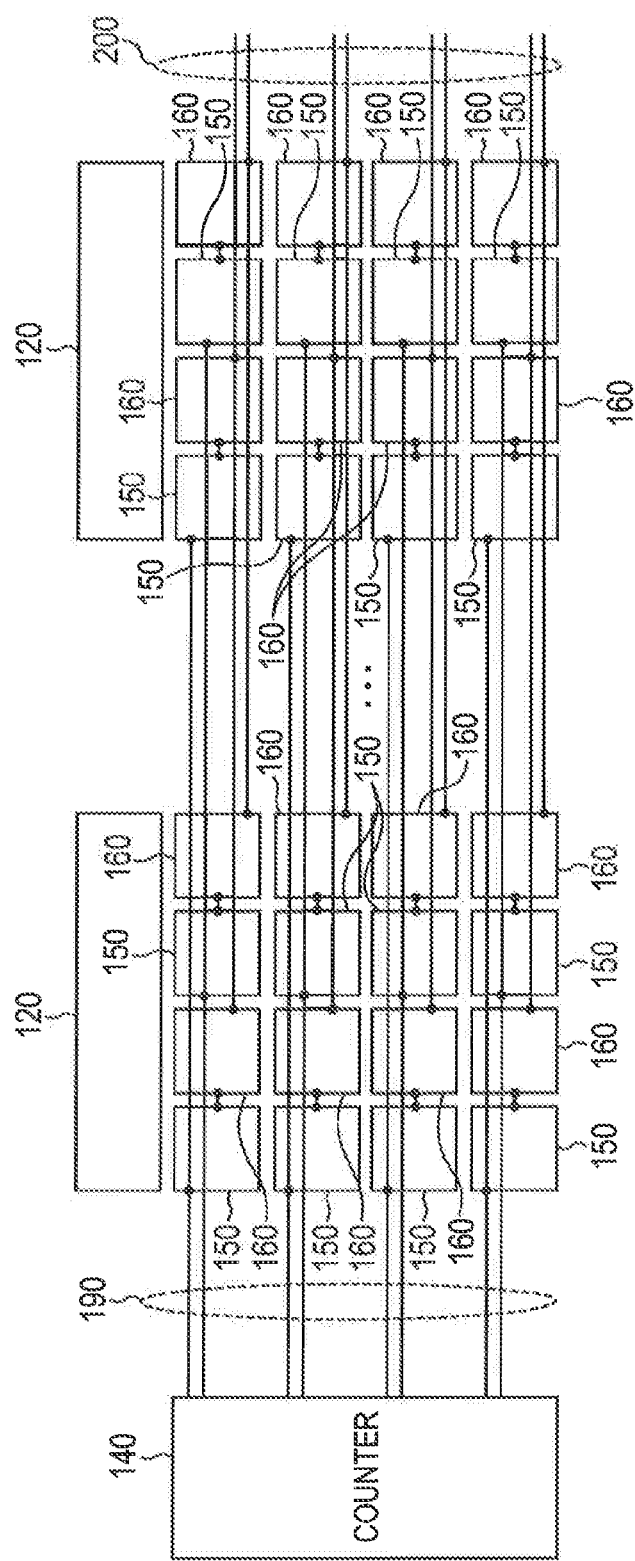
FIG. 11 is a circuit block diagram illustrating a configuration example of a second embodiment of the present invention.
Figure 12:
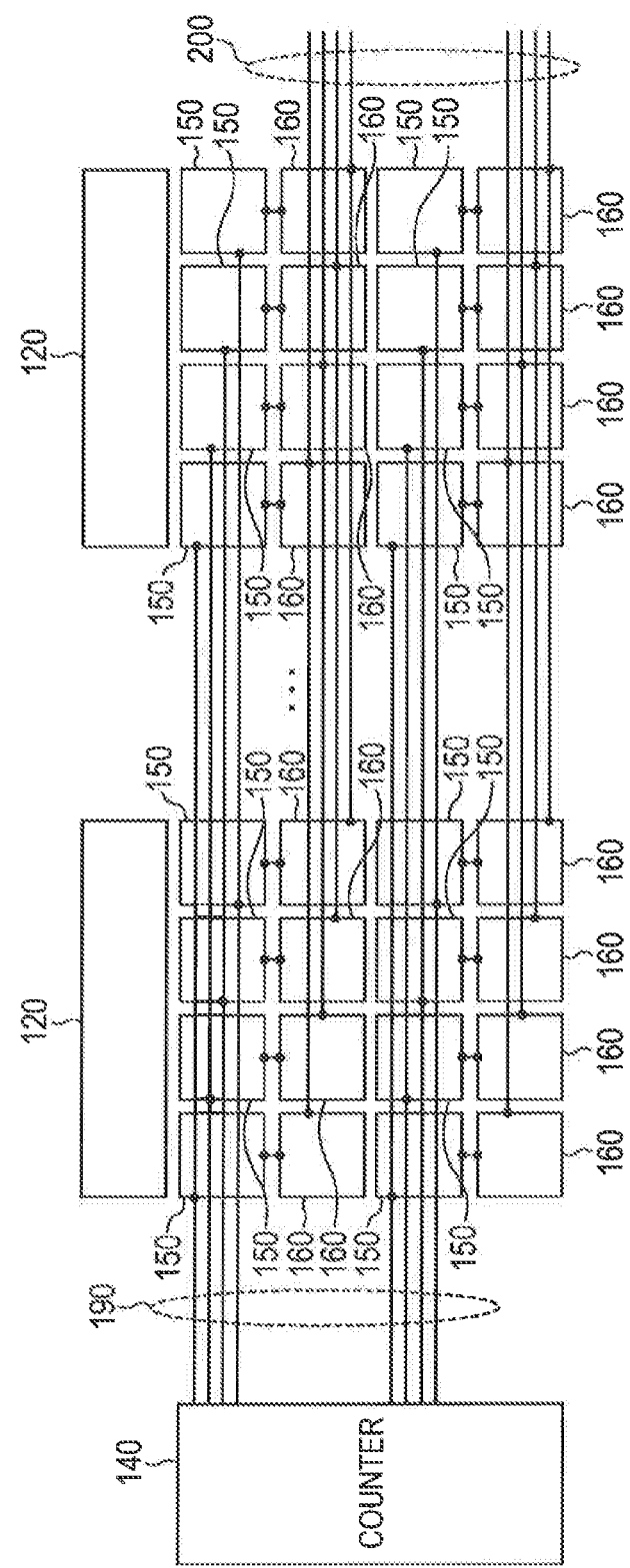
FIG. 12 is a circuit block diagram illustrating the configuration example of the first embodiment of the present invention.

FIG. 11 is a view illustrating a configuration example of a solid-state imaging apparatus according to a second embodiment of the present invention. However, here, only points which are different from those in the above described first embodiment will be described. In FIG. 11, two pairs of the storage units are arrayed in the row direction, and four pairs of the storage units are arrayed in the column direction, in each of which the first storage unit 150 and the second storage unit 160 corresponding to the same bit are arranged adjacent to each other in a direction along the row and are regarded as a pair. In other words, the first storage unit 150 and the second storage unit 160 in the each pair are arrayed adjacent to each other in a direction along the row of the pixels 100. However, as is illustrated in FIG. 6, the area of the second storage unit 160 and the height thereof in the column direction are larger than those of the first storage unit 150. Therefore, when the first storage unit 150 and the second storage unit 160 are arranged adjacent to each other in the direction along the row and are regarded as a pair, the height of the pair is determined by the height of the second storage unit 160. Therefore, such an area becomes necessary as to correspond to the height of the second storage unit 160×4. In contrast to this, when a pair of storage units are arranged in a two-dimensional form, in which the first storage units 150 and the second storage units 160 corresponding to the same bit are arranged adjacent to each other in the direction along the column and are regarded as a pair, the configuration becomes as illustrated in FIG. 12 similarly to that in FIG. 2. Four pairs of the storage units are arrayed in the direction along the row, and two pairs of the storage units are arrayed in the direction along the column. In this case, the area corresponds to the height of the first storage unit 150×2+the height of the second storage unit 160×2, and the area can be reduced. Therefore, from the viewpoint of the reduction of the area, an example in which the first storage unit 150 and the second storage unit 160 are arranged adjacent to each other in the direction along the column and are regarded as a pair, in other words, the first embodiment can be selected compared to the second embodiment.

Third Embodiment

Figure 13:
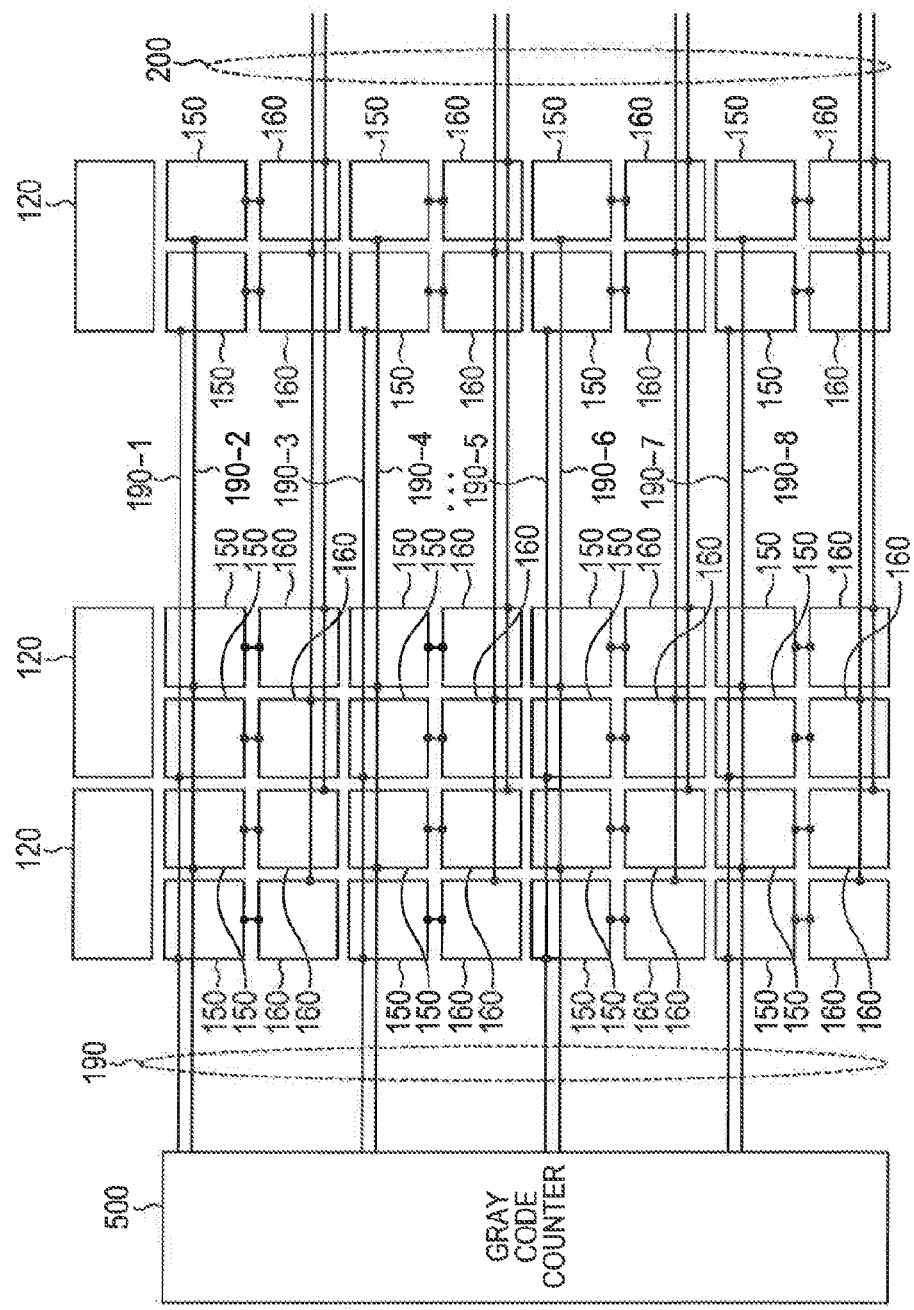
FIG. 13 is a circuit block diagram illustrating a configuration example of a third embodiment of the present invention.

FIG. 13 is a view illustrating a configuration example of a solid-state imaging apparatus according to a third embodiment of the present invention. However, here, only points which are different from those in the above described first embodiment will be described. In FIG. 13, a gray code counter 500 is used for the counter 140. As for a count value of the gray code, which is counted by the gray code counter 500, a humming distance between one count value and an adjacent next count value is 1. Hereby, the aggravation of the linearity characteristics of the A/D conversion can be reduced. A data line 190 has data lines 190-1 to 190-8 for 8 bits. When the pair of the storage units are arranged in a two-dimensional form, which includes the first storage unit 150 and the second storage unit 160, a plurality of first storage units 150 are arranged at the same height. Accordingly, the data lines occasionally appear which are arranged adjacent to each other, such as the data line 190-1 and the data line 190-2, for instance. In such a case, if a binary counter is used, for instance, the binary counter exerts a bad influence on the characteristics of the A/D conversion. This point will be described below.

Figure 14:
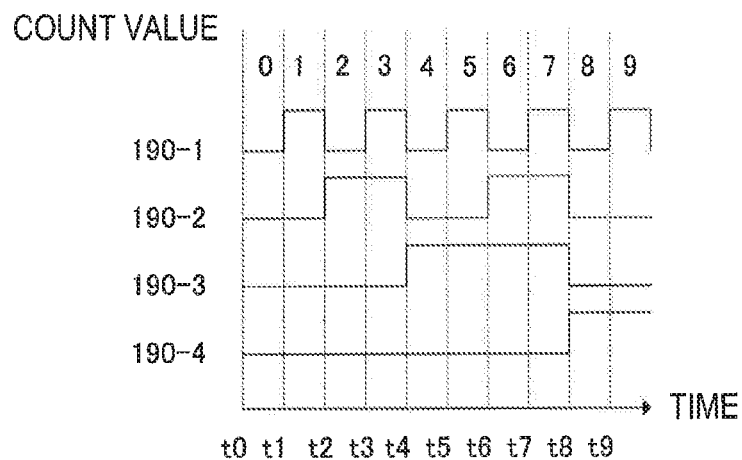
FIG. 14 is a timing chart according to the third embodiment of the present invention.

FIG. 14 is a view illustrating time waveforms of signals of data lines 190-1 to 190-4 when a binary counter is used for the counter 140. The counting progresses in such a way that a count value from the time t0 to the time t1 is 0, and a count value from the time t1 to a time t2 is 1. Here, focus attention on the signals of the two data lines 190-1 and 190-2. At the time t1, the signal of the data line 190-1 makes a transition from a low level to a high level, and the signal of the data line 190-2 does not make a transition. At this time, in FIG. 13, a coupling capacitor Cc is charged which is formed between the data line 190-1 and the data line 190-2, and thereby the potential of the data line 190-1 makes a transition to a high level. On the other hand, at the time t2, the signal of the data line 190-1 makes a transition to the low level from the high level, and the signal of the data line 190-2 makes a transition to a high level from a low level. In other words, the signals of the data line 190-1 and the data line 190-2 change in a reverse direction. Accordingly, the amount of electric charges for charging or discharging the coupling capacitor Cc becomes double, and the coupling capacitor Cc apparently functions as if having a capacitance value of 2×Cc. Hereby, in FIG. 14, the change of the signals of the data line 190-1 and the data line 190-2 at the time t2 becomes slow, the time width of a period of the count value 1 becomes wide, and the time width of a period of the count value 2 results in becoming narrow. This means that the linearity of the A/D conversion is aggravated.

Figure 15:
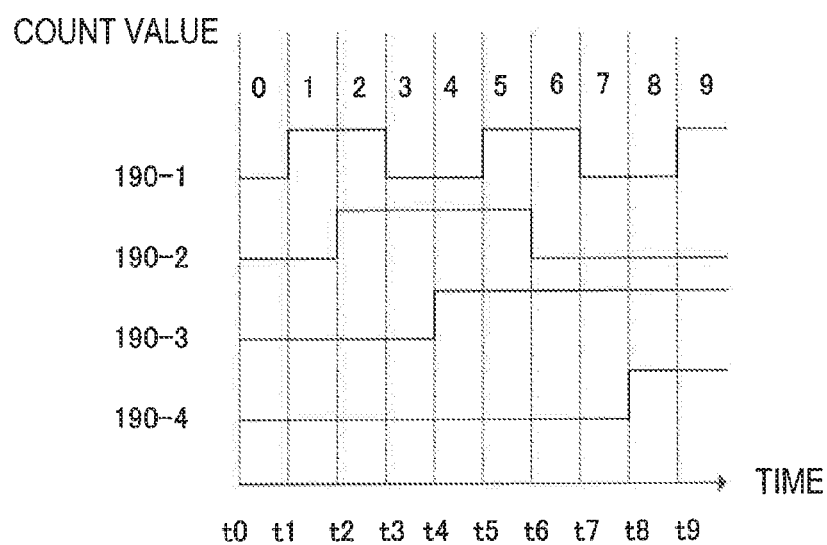
FIG. 15 is a timing chart according to the third embodiment of the present invention.

FIG. 15 is a view-illustrating time waveforms of the signals of the data lines 190-1 to 190-4 in the case where the gray code counter 500 is used as the counter 140. The counting progresses in such a way that a count value from the time t0 to the time t1 is 0, and a count value from the time t1 to a time t2 is 1. In the gray code counter 500, only the signal of one data line makes a transition at the timing at which any count value is switched. At the time t1, for instance, only the signal of the data line 190-1 makes a transition, and at the time t2, only the signal of the data line 190-2 makes a transition. Therefore, in FIG. 13, the coupling capacitor between the data lines 190 for a plurality of bits always works as an earth capacitor. Hereby, the aggravation of the linearity characteristics of the A/D conversion can be reduced.

Fourth Embodiment

Figure 16:
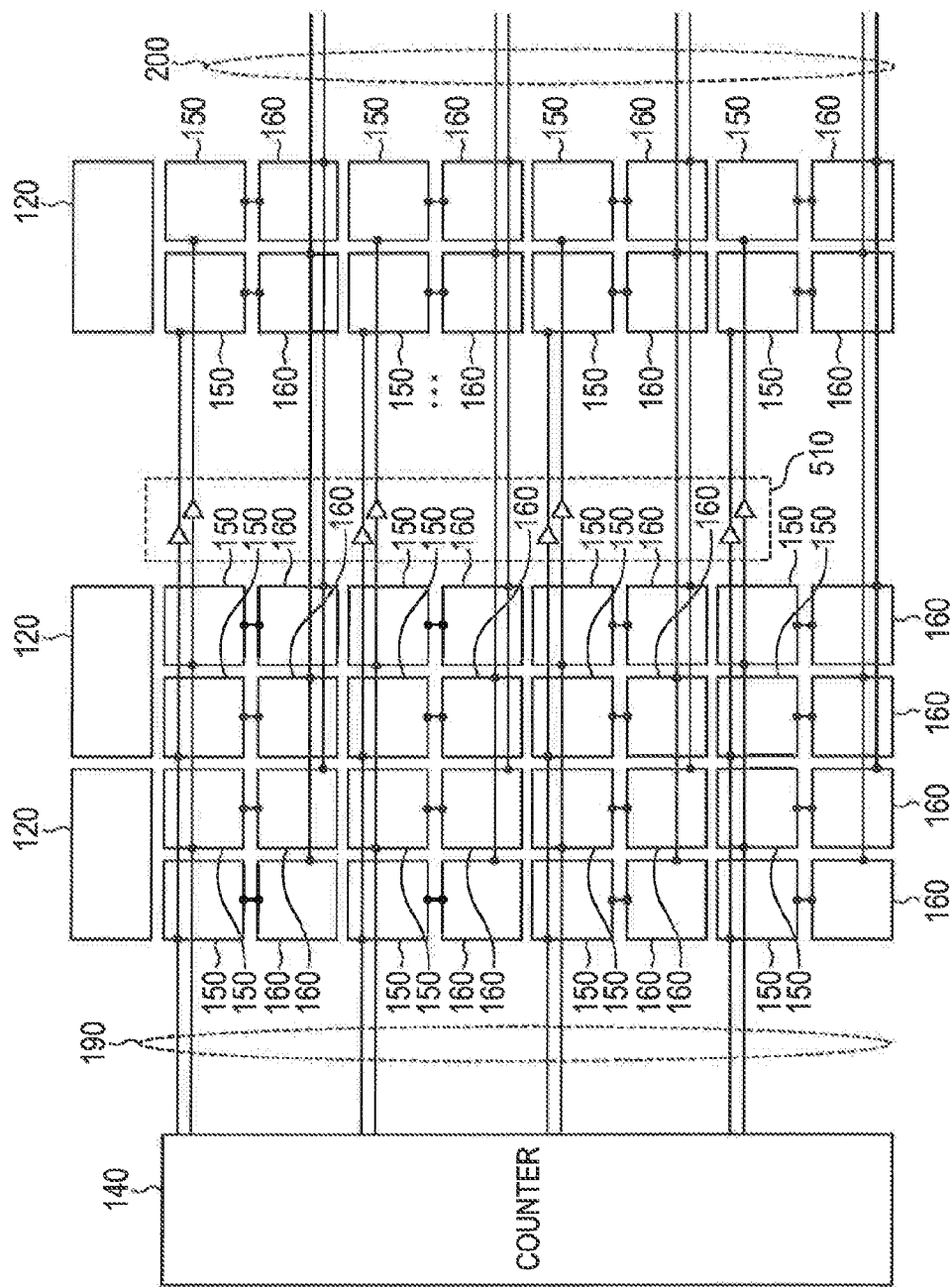
FIG. 16 is a circuit block diagram illustrating a configuration example of a fourth embodiment of the present invention.

FIG. 16 is a view illustrating a configuration example of a solid-state imaging apparatus according to a fourth embodiment of the present invention. However, here, only points which are different from those in the above described first embodiment will be described. In FIG. 16, a repeat buffer 510 is provided in each of data lines 190 for a plurality of bits. The repeat buffer 510 is provided in the data line 190 for each bit between the first storage unit 150 in the left half and the first storage unit 150 in the right half, and amplifies the signal of the data line 190. The counter 140 inputs an output value to the first storage unit 150 in the right half (one part) through the repeat buffer 510. The counter 140 inputs the output value to the first storage unit 150 in the left half (other part) without through the repeat buffer 510. A distance between the first storage unit 150 in the right half and the counter 140 is longer than a distance between the first storage unit 150 in the left half and the counter 140. Hereby, the repeat buffer 510 can prevent an error of the A/D conversion value from occurring due to the coupling which occurs between the data lines 190 for a plurality of bits.

Fifth Embodiment

Figure 17:
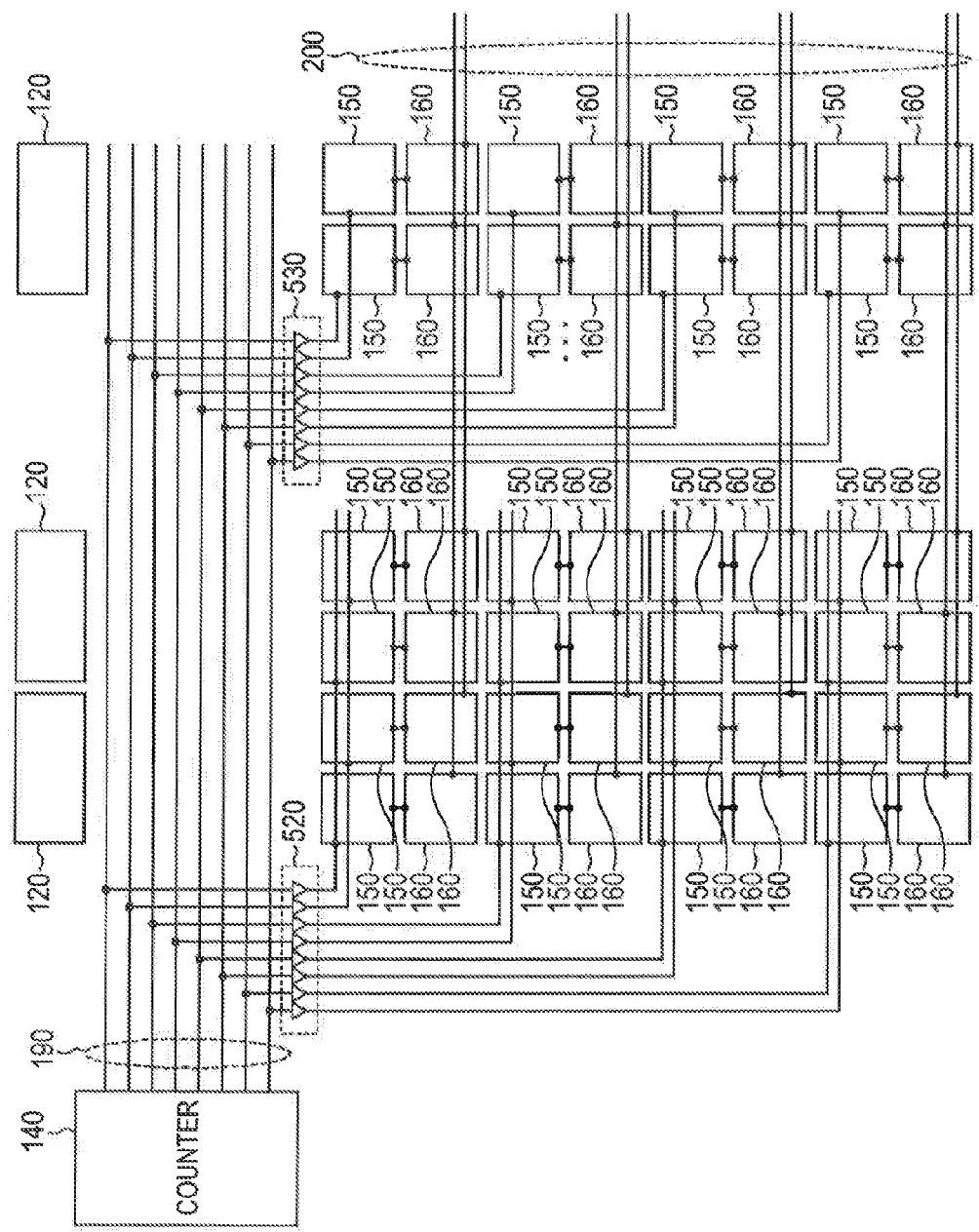
FIG. 17 is a circuit block diagram illustrating a configuration example of a fifth embodiment of the present invention.

FIG. 17 is a view illustrating a configuration example of a solid-state imaging apparatus according to a fifth embodiment of the present invention. However, here, only points which are different from those in the above described fourth embodiment will be described. In FIG. 17, buffers 520 and 530 are provided in each of the data lines 190 for the plurality of bits. The buffers 520 and 530 amplify the output value of the same bit of the data line 190 of the counter 140. The counter 140 inputs an output value to the first storage unit 150 in the left half (one part) through a first buffer 520. The counter 140 inputs the output value to the first storage unit 150 in the right half (other part) through a second buffer 530. Hereby, the repeat buffer 510 can prevent an error of the A/D conversion value from occurring due to the coupling which occurs between the data lines 190, in a region in which a distance between the data lines 190 in the first storage unit 150 is close to each other. In addition, in FIG. 16, the data line 190 must drive a large number of the first storage units 150, but in FIG. 17, the data line 190 may drive only buffers 520 and 530, and can arrange the data lines 190 so that the distance between the data lines 190 becomes wide. Hereby, the load on the data line 190 is reduced, and the amount of delay of the count signal which is transmitted on the data line 190 can be reduced. Even when the A/D conversion values ideally become constant in all of the columns, if the count signal delays, as the column becomes more distant from the counter 140, the A/D conversion value gradually becomes larger, which causes a noise of shading. Therefore, the configuration of FIG. 17 can reduce the shading.

The above described first embodiment has been described while taking the case as an example, where one A/D converting unit is provided in each of the columns of the pixels 100, and an equation of pixel pitch=A/D converting unit holds, but the present invention is not limited to the case. Any pitch is acceptable out of a pitch satisfying pixel pitch>A/D converting unit and a pitch satisfying pixel pitch<A/D converting unit.

In addition, the first to fifth embodiments have been described while taking the case as an example, where the accuracy of the A/D conversion is 8 bits, but the present invention is not limited to the case.

In addition, the first embodiment has been described while taking the configuration as an example, in which the CMOS switch 210, the inverter 220 and the tristate inverter 230 are used for the first storage unit 150, but the present invention is not limited to the configuration. In addition, the first embodiment has been described while taking the configuration as an example, in which the CMOS switch 240, the inverter 250 and the two tristate inverters 260 and 270 are used for the second storage unit 160, but the present invention is not limited to the configuration.

In addition, the first to fifth embodiments have been described while taking the case as an example, where the number of the first storage units 150 and the second storage units 160 is 2 to 4, which are aligned with respect to one comparator 120 in the row direction, but the present invention is not limited to the case. The number may be 5 or more.

Sixth Embodiment

Figure 18:
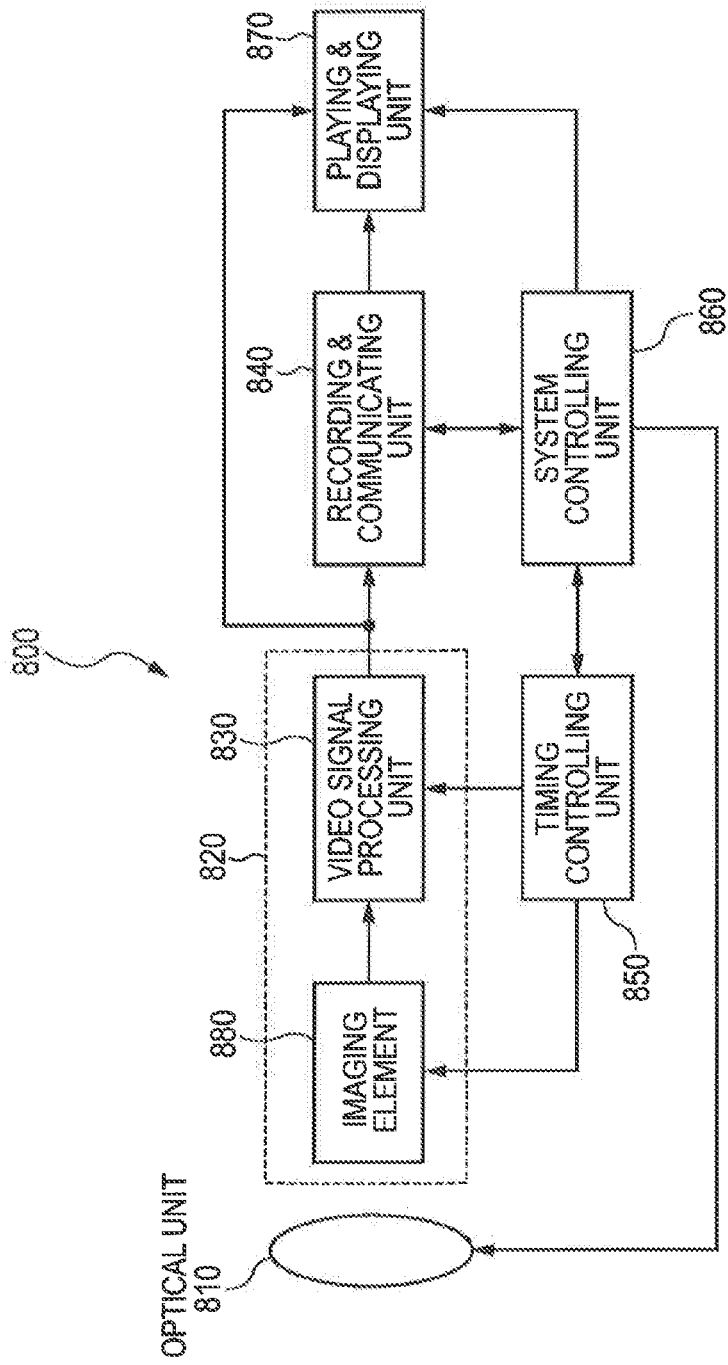
FIG. 18 is a circuit block diagram illustrating a configuration example of a sixth embodiment of the present invention.

FIG. 18 is a view illustrating a configuration example of an imaging system according to a sixth embodiment of the present invention. An imaging system 800 includes, for instance, an optical unit 810, an imaging element 880, a video signal processing unit 830, a recording & communicating unit 840, a timing controlling unit 850, a system controlling unit 860, and a playing & displaying unit 870. An imaging apparatus 820 has the imaging element 880 and the video signal processing unit 830. The solid-state imaging apparatus described in the previous embodiment is used for the imaging element 880.

The optical unit 810 that is an optical system such as a lens focuses an image of light emitted from an object onto a pixel unit of the imaging element 880, in which a plurality of pixels 100 are two-dimensionally arrayed, and forms an image of the object on the pixel unit. The imaging element 880 outputs signals according to the light of which the image has been focused on the pixel unit, on the timing based on the signal output from the timing controlling unit 850. The signals output from the imaging element 880 are input into the video signal processing unit 830, and the video signal processing unit 830 performs signal processing with a specified method by a program or the like. The signals obtained by the processing in the video signal processing unit 830 are sent to the recording & communicating unit 840 as an image data. The recording & communicating unit 840 sends signals for forming an image to the playing & displaying unit 870, and makes the playing & displaying unit 870 play and display a moving image or a still image. The recording & communicating unit 840 also communicates with the system controlling unit 860 by receiving the signals sent from the video signal processing unit 830, and besides, performs also an operation of recording the signals for forming an image on an unillustrated recording medium.

The system controlling unit 860 is a unit for collectively controlling an operation of the imaging system, and controls drives of the optical unit 810, the timing controlling unit 850, the recording & communicating unit 840, and the playing & displaying unit 870. In addition, the system controlling unit 860 is provided, for instance, with an unillustrated storage device that is a recording medium, and records a program and the like which are necessary for controlling the operation of the imaging system, in the storage device. The system controlling unit 860 also supplies, for instance, a signal which switches driving modes according to an operation of a user, into the imaging system. Specific examples include: a signal for a change of a row to be read or a row to be reset; a signal for a change of an angle of view, which accompanies an operation of an electronic zoom; and a signal for a shift of an angle of view, which accompanies electronic vibration control. The timing controlling unit 850 controls the driving timings for the imaging element 880 and the video signal processing unit 830 based on the control by the system controlling unit 860.

Note that the above embodiments are merely examples how the present invention can be practiced, and the technical scope of the present invention should not be restrictedly interpreted by the embodiments. In other words, the present invention can be practiced in various ways without departing from the technical concept or main features of the invention.

In the solid-state imaging apparatus, n-pairs are arrayed in a matrix, and thereby an area of a chip can be reduced.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-006145, filed Jan. 16, 2014, which is hereby incorporated by reference herein in its entirety.

What is claimed is:

1. A solid-state imaging apparatus comprising:
a plurality of pixels arranged in a matrix, and generating an image signal by photoelectric conversion; and
a plurality of A/D converting units, each arranged correspondingly to one of columns of the matrix, to convert the image signal into a n-bit digital value, n being an integer equal to or larger than 2,
wherein each of the plurality of A/D converting units comprises:
a plurality of first storage units configured to store the n-bit digital value one bit by one bit, and
a plurality of second storage units each arranged correspondingly to each of the plurality of first storage units, to hold the digital value transferred from the first storage unit, and
wherein:
the plurality of first storage units and the plurality of second storage units form first and second pairs, each pair including the first storage unit and the second storage unit storing the digital value of the same bit,
the first and second pairs are adjacent to each other,
the first storage unit of the first pair and the first storage unit of the second pair are connected to a common control line configured to control an operation of the storing, and
the second storage unit of the first pair and the second storage unit of the second pair are connected to a common control line configured to control an operation of the storing.

2. The solid-state imaging apparatus according to claim 1, wherein the first storage unit and the second storage unit in each pair are arranged adjacent each other in a direction along the column of the pixels, and
the second storage unit of one of the first and second pairs is arranged between the first storage unit of the one of the first and second pairs and the first storage unit of the other one of the first and second pairs.

3. The solid-state imaging apparatus according to claim 1, wherein the first storage unit and the second storage unit in the each pair are arranged adjacent each other in a direction along a row of the pixels, and
the second storage unit of one of the first and second pairs is arranged between the first storage unit of the one of the first and second pairs and the first storage unit of the other one of the first and second pairs.

4. The solid-state imaging apparatus according to claim 1, wherein the first storage unit has a plurality of NMOS transistors arranged in a direction along the column of the pixels, and a plurality of PMOS transistors arranged in the direction along the column of the pixels, and
the second storage unit has a plurality of NMOS transistors arranged in the direction along the column of the pixels, and a plurality of PMOS transistors arranged in the direction along the column of the pixels.

5. The solid-state imaging apparatus according to claim 1, wherein the first storage unit has a plurality of NMOS transistors arranged in a direction along a row of the pixels, and a plurality of PMOS transistors arranged in the direction along the row of the pixels, and
the second storage unit has a plurality of NMOS transistors arranged in the direction along the row of the pixels, and a plurality of PMOS transistors arranged in the direction along the row of the pixels.

6. The solid-state imaging apparatus according to claim 1, wherein two adjacent pairs of the first and second storage units are arranged in a layout in line symmetry.

7. The solid-state imaging apparatus according to claim 1, wherein the plurality of A/D converting units has a counter configured to count and output the n-bit digital value; and a plurality of comparators, each arranged correspondingly to one of columns of the pixels, configured to compare the pixel signal of the pixel with a reference signal changing as time elapses, and
wherein the plurality of first storage units are arranged, such that each n first storage units are arranged correspondingly to the one of columns of the plurality of pixels, according to a comparing result of the comparator in each column, the first storage unit holds, one bit by one bit, the n-bit digital value output from the counter.

8. The solid-state imaging apparatus according to claim 7, wherein the counter is Gray code counter, keeping Hamming distance of 1 between one and next count values.

9. The solid-state imaging apparatus according to claim 8, wherein one or more of the plurality of first storage units input the n-bit digital value output from the counter through a repeat buffer,
the other of the plurality of first storage units inputs the n-bit digital value output from the counter not through a repeat buffer, and
a distance between the one or more of the plurality of first storage units and the counter is longer than a distance between the other of the plurality of first storage units inputs and the counter.

10. The solid-state imaging apparatus according to claim 9, further comprising first and second buffers configured to amplify an output value of a same bit from the counter, wherein
the one or more of the plurality of first storage units input the output value from the counter through the first buffer, and
the other of the plurality of first storage units inputs the output value from the counter through the second buffer.

11. The solid-state imaging apparatus according to claim 8, further comprising first and second buffers configured to amplify an output value of a same bit from the counter, wherein
the one or more of the plurality of first storage units input the output value from the counter through the first buffer, and
the other of the plurality of first storage units inputs the output value from the counter through the second buffer.

12. The solid-state imaging apparatus according to claim 7, wherein one or more of the plurality of first storage units input the n-bit digital value output from the counter through a repeat buffer,
the other of the plurality of first storage units inputs the n-bit digital value output from the counter not through a repeat buffer, and
a distance between the one or more of the plurality of first storage units and the counter is longer than a distance between the other of the plurality of first storage units inputs and the counter.

13. The solid-state imaging apparatus according to claim 12, further comprising first and second buffers configured to amplify an output value of a same bit from the counter, wherein
the one or more of the plurality of first storage units input the output value from the counter through the first buffer, and
the other of the plurality of first storage units inputs the output value from the counter through the second buffer.

14. The solid-state imaging apparatus according to claim 7, further comprising first and second buffers configured to amplify an output value of a same bit from the counter, wherein
the one or more of the plurality of first storage units input the output value from the counter through the first buffer, and
the other of the plurality of first storage units inputs the output value from the counter through the second buffer.

15. An imaging system comprising:
a solid-state imaging apparatus;
an optical system configured to form an image onto the plurality of pixels; and
a video signal processing unit configured to process a signal outputted from the solid-state imaging apparatus, to generate an image data, wherein
the solid-state imaging apparatus comprises:
a plurality of pixels arranged in a matrix, and generating an image signal by photoelectric conversion; and
a plurality of A/D converting units, each arranged correspondingly to one of columns of the matrix, to convert the image signal into a n-bit digital value, n being an integer equal to or larger than 2,
wherein each of the plurality of A/D converting units comprises
a plurality of first storage units configured to store the n-bit digital value one bit by one bit, and
a plurality of second storage units each arranged correspondingly to one of the plurality of first storage units, to hold the digital value transferred from the first storage unit, and
wherein: the plurality of first storage units and the plurality of second storage units form first and second pairs, each pair including the first storage unit and the second storage unit storing the digital value of the same bit,
the first and second pairs are adjacent to each other,
the first storage unit of the first pair and the first storage unit of the second pair are connected to a common control line configured to control an operation of the storing, and
the second storage unit of the first pair and the second storage unit of the second pair are connected to a common control line configured to control an operation of the storing.

* * * * *